United States Patent [19]
Yanagida

[11] Patent Number: 6,013,580
[45] Date of Patent: Jan. 11, 2000

[54] PREPROCESSING METHOD OF METAL FILM FORMING PROCESS

[75] Inventor: Toshiharu Yanagida, Kanagawa, Japan

[73] Assignee: Sony Corporation, Japan

[21] Appl. No.: 08/969,698

[22] Filed: Nov. 13, 1997

Related U.S. Application Data

[62] Division of application No. 08/592,543, Jan. 26, 1996.

[30] Foreign Application Priority Data

Jan. 31, 1995 [JP] Japan .................................. 7-013377

[51] Int. Cl.[7] .................................................. H01L 21/302
[52] U.S. Cl. .............................. 438/710; 216/37; 216/67; 216/69
[58] Field of Search .................................. 438/670, 614, 438/695, 710; 216/37, 67, 69

[56] References Cited

U.S. PATENT DOCUMENTS

| | | | |
|---|---|---|---|
| 5,378,311 | 1/1995 | Nagayama et al. ..................... | 438/710 |
| 5,447,598 | 9/1995 | Mihard et al. ........................... | 438/695 |
| 5,462,638 | 10/1995 | Datta et al. .............................. | 438/614 |
| 5,486,483 | 1/1996 | Lammert .................................. | 438/670 |
| 5,498,312 | 3/1996 | Laermer et al. ......................... | 438/695 |
| 5,705,432 | 1/1998 | Lee et al. ................................. | 438/670 |

*Primary Examiner*—Kevin M. Picardat
*Attorney, Agent, or Firm*—Rader, Fishman & Grauer; Ronald P. Kananen

[57] ABSTRACT

A preprocessing method of a metal film formation process before formation of a BLM film on a resist film of a substrate to be processed, wherein the resist film of substrate to be processed is irradiated with plasma, utilizing a plasma processing apparatus providing independent plasma generating power source and substrate bias power source to form an overhand area at the end face of a connecting hole and change the property of the surface area. The plasma generating power and substrate bias voltage can be set adequately. Thereby irradiation of plasma can be performed easily, change of property at the surface of resist film can be done quickly and shape control of the end face of the connecting hole can also be executed very easily.

16 Claims, 5 Drawing Sheets

PREPROCESSING METHOD OF METAL FILM FORMING PROCESS

This application is a divisional of application Ser. No. 08/592,543 filed Jan. 26, 1996.

BACKGROUND OF THE INVENTION

1. Field of the Invention

The present invention relates to a method of preprocessing of the process to form a multilayered metal film which becomes an underlayer of a bump which is a part of the manufacturing process of a flip chip IC in which a bump consisting of a metal is formed at the surface of a semiconductor base material through surface contact with an electrode formed at the surface of a printed circuit board.

2. Description of the Related Arts

It is a very important point for further progress in reducing the size of electronic devices to improve a part loading capacity. In regard to a semiconductor IC, development of a high density loading technique by introduction of a flip chip in place of the conventional package loading has been pursued with maximum effort.

Figure 8:
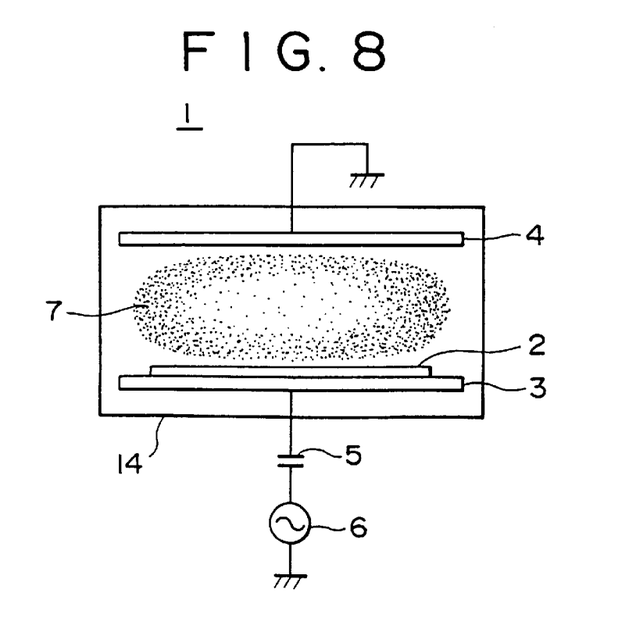
FIG. 8 is a cross-sectional view of a parallel flat plate type plasma processing apparatus used in the related arts.

A flip chip loading method is classified into several methods such as the Au stud bump method and the solder ball bump method, etc., and a barrier metal is used, in any method thereof, between an electrode pad and the bump material of the semiconductor IC in order to improve close contact and to prevent mutual diffusion therebetween. In the case of the solder ball bump, this method is called a BLM (Ball Limiting Metal) from the point of view that such barrier metal plays a role of deciding the final shape of the bump. The typical structure of a BLM film in the solder bump method, has the three-layer structure of Cr, Cu and Au. The Cu layer as the under layer works as a layer being in contact with an electrode pad, while the Cu layer as a layer preventing diffusion of solder and the Au metal layer as the upper layer works as a layer preventing oxidation of the Cu. As a patterning method of the BLM film, there is provided a wet etching method using chemicals, but this method has a problem of workability, a problem in the environmental and hygienic aspects such as waste fluid processing and a problem that processing accuracy is bad. Therefore, as part of the patterning method of a BLM film, it is also discussed to introduce the lift-off process in which a photoresist film is deposited and thereafter it is lifted off. In this case, the BLM film is generally formed by a sputtering apparatus but it tends to be formed up to the side wall surface of the resist pattern as the under layer. Thereby, the resist remover does not penetrate at the lift-off time, making it difficult to remove the unwanted BLM film. Therefore, it is required for improvement of lift-off characteristic in the lift-off work to control the shape of the end surface of the photoresist aperture to have an overhang area. As a method of controlling the shape of the resist, it can be realized by modification of the lithography process, but this method has a problem in that the number of processes increases and therefore it is an ideal method that the shape of resist pattern is simultaneously controlled in the plasma irradiation process which is usually performed in the preprocessing of the BLM film sputtering. In the related arts, the RF parallel flat plate type plasma processing apparatus as shown in FIG. 8 has generally been used for plasma irradiation process which is performed before formation of a metal film. In the plasma processing apparatus of FIG. 8, a stage (cathode plate) 3 loading thereon a substrate 2 to be processed is positioned within an evacuated plasma processing chamber 14, an anode plate 4 is arranged at the position opposed to the stage and a high frequency power supply 6 is connected to the stage (cathode plate) 3 via a coupling capacitor 5. However, attempts at shape control by the RF etching in this plasma processing apparatus generates a problem that exfoliation in the lift-off process becomes difficult due to some reasons that a single structure of the power supply of the plasma processing apparatus of this type allows only adjustment of the high frequency power which determines density of plasma and the bias voltage which determines ion energy under the predetermined relationship therebetween, low plasma density results in considerable processing time as long as about 5 to 6 minutes, highly preset high frequency power inevitably results in a higher bias voltage which causes the ion energy applied to the substrate to increase, and a thermally changing region extends up to the boundary surface for the lower layer exceeding the surface layer of resist bringing about the condition that the burned resist is stuck to the lower layer.

SUMMARY OF THE INVENTION

It is therefore an object of the present invention to provide a preprocessing method of metal film formation process utilizing a plasma processing apparatus which assures easy shape control of resist film without giving any influence on the lower layers in the preprocessing of the BLM (Ball Limiting Metal) film formation process on the occasion of forming a ball bump of a flip chip IC, etc.

In order to achieve this object, according to the first aspect, the present invention has provided a preprocessing method of the metal film formation process utilizing a plasma processing apparatus having a couple of high frequency power supplies which can independently set a plasma generating power and a substrate bias voltage. According to the second aspect, the present invention has provided a preprocessing method of the metal film formation process in which property of the upper surface of a photoresist film is changed and the end surface of an aperture is shaped to have an overhang area. Moreover, according to the third aspect, the present invention has provided a preprocessing method of the metal film formation process utilizing a high density plasma processing apparatus which obtains the plasma density of $1 \times 10^{11}$ cm$^{-3}$ or higher but under $1 \times 10^{14}$ cm$^{-3}$ such as an ICP (Inductively Coupled Plasma) apparatus, a TCP (Transform Coupled Plasma) apparatus and helicone wave plasma apparatus, etc. Furthermore, according to the fourth aspect, the present invention has provided a preprocessing method of the metal film formation process utilizing a plasma processing apparatus including a temperature control mechanism in a wafer loading section.

With employment of the present invention, there is provided a processing method which enables reasonable setting of both plasma generating voltage and substrate bias voltage and quick and uniform processing even for a large diameter wafers in the preprocessing of metal film formation process at the time of patterning a metal film utilizing formation and exfoliation (lift-off) of the photoresist film. As a result, in the preprocessing of the BLM film formation process to form a ball bump, it has been made possible to form excellent pattern of the BLM film by processing the resist to the best condition for the lift-off process without causing the resist to be burned and stick to the under layer due to the excessive thermal change thereof.

BRIEF DESCRIPTION OF THE DRAWINGS

Other objects and advantages of the present invention will be apparent from the following detailed description of the presently preferred embodiments thereof, which description should be considered in conjunction with the accompanying drawings in which:

FIGS 1A to 1D illustrate cross-sectional views showing the conditions of a substrate to be processed in the sequence of the processing steps to which the present invention is applied:

DETAILED DESCRIPTION OF THE PREFERRED EMBODIMENTS

A preprocessing method of metal film formation process of a the present invention will be explained with reference to FIG. 1 to FIG. 7.

Embodiment 1

This embodiment, in which the present invention is applied using a triode type plasma processing apparatus to the preprocessing of a film formation process in the sputtering of BLM consisting of a metal film at the time of forming a solder ball bump, will be explained with reference to FIG. 1 to FIG. 3.

Figure 1A:
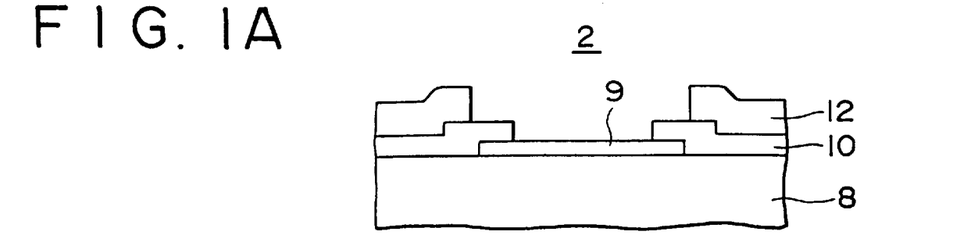
FIG. 1A shows the condition where a photoresist film is formed in the periphery of a connecting hole of a passivation film provided partly on an electrode pad.

In this embodiment, on a wafer (substrate 2 to be processed) prepared as a sample, as shown in FIG. 1A, a passivation film (surface protecting film) 10 of polyimide or silicon nitride film, etc. is formed on an aluminum electrode pad 9 of a semiconductor base material 8, a connecting hole 11 is made of a predetermined size, and a photoresist film 12 is patterned on the upper layer thereof with an aperture diameter which is larger than the aperature in the passivation film 10. In order to form a film on this wafer, a triode type plasma processing apparatus shown in FIG. 2 is also prepared. The triode type plasma processing apparatus shown in FIG. 2 comprises a substrate stage 3 for loading a substrate 2 to be processed, an anode plate 4 arranged keeping the predetermined interval to the substrate stage 3 and a grid electrode 13 grounded between the substrate stage 3 and the anode plate 4 surrounded by a plasma processing chamber 14 consisting of quartz, connects a plasma power supply (plasma generating power supply) 15 to the anode plate 4 and a substrate bias power supply 16 to the stage 3 and supplies argon gas to the plasma processing chamber 14. In order to keep the substrate 2 to be processed to the temperature of 100° C. to 120° C. just suitable for plasma processing, the substrate stage 3 has a further detailed structure, as shown in FIG. 3, that freon or ethanol or nitrogen, for example, is supplied as a first coolant 17 to the coolant path provided within the substrate stage 3 consisting of aluminum, while argon or helium, for example, is supplied as a second coolant 18 at the lower surface of the substrate 2 to be processed from the other coolant path. Moreover, the substrate stage 3 is also provided with an electrostatic chuck 19 for attracting the substrate 2 to be processed with an electrostatic force.

Figure 2:
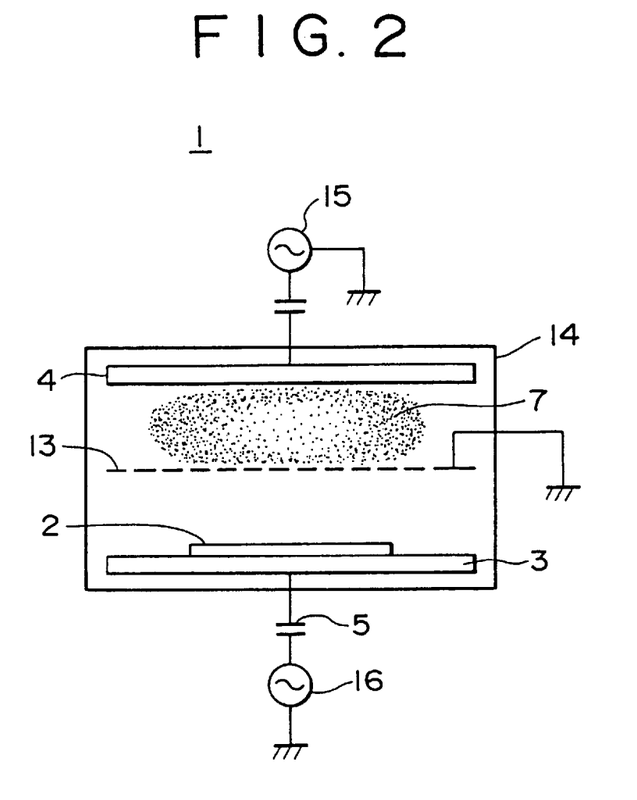
FIG. 2 is a cross-sectional view of a triode type plasma processing apparatus used in the present invention.

Using the plasma processing apparatus shown in FIG. 2, a wafer (substrate 2 to be processed) shown in FIG. 1A is placed on the stage 3 and the preprocessing of film formation process has been conducted under the following conditions:

Argon gas flow rate: 25 sccm

Argon gas pressure: 5 mTorr (0.67 Pa)

Plasma power: 700 W (2 MHz)

Substrate bias voltage: 300 V (13.56 MHz)

Figure 1B:
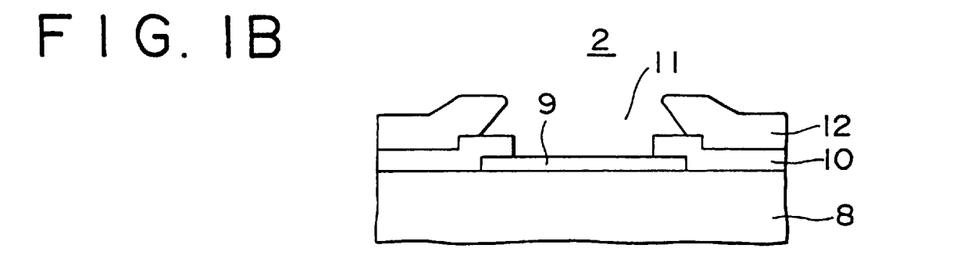
FIG. 1B shows the condition where surface condition of the photoresist film is changed due to the preprocessing of film formation.
Figure 1C:
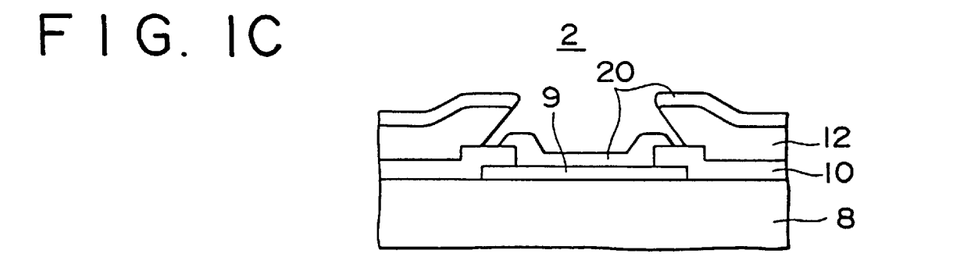
FIG. 1C shows the condition where a BLM film is formed.
Figure 1D:
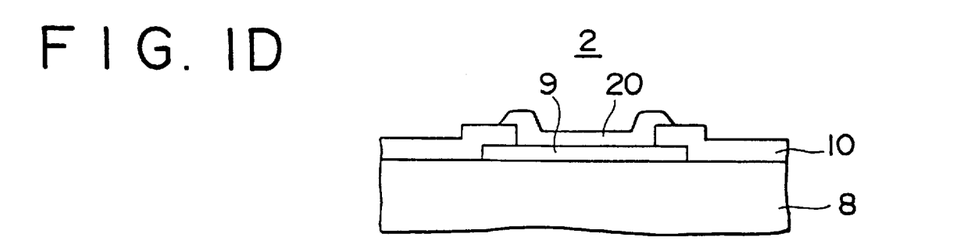
FIG. 1D shows the condition where the resist film is lifted off to finish the patterning of the BLM film.

Regarding the condition of the substrate 2 to be processed after the plasma processing, as shown in FIG. 1B, the upper part of the photoresist film 12 up-diffuses with thermal expansion by irradiation of plasma 7 ($Ar^+$ ion) and the surface property can be changed moderately simultaneously with formation of the overhang area at the upper part of the connecting hole 11. Moreover, the substrate 2 having completed the processing is then transferred to a metal film forming apparatus such as a sputtering apparatus (not illustrated) coupled with the plasma processing chamber under the highly evacuated condition to form a laminated film of Cu, Cu, Au, etc., that is, a BLM film (metal film) 20. The condition of this processing is shown in FIG. 1C. The BLM film is not formed at the side wall surface of the resist pattern having the overhang area and the BLM film 20 can be divided into the upper part on the electrode pad 9 and the upper part on the photoresist film 12. The substrate 2 under this condition is then soaked, for example, into the resist remover consisting of dimethyl sulfoxide $(CH_3)_2SO$ and N-methyl-2-pyrrolidone $CE_3NC_4H_6O$. As a result, as shown in FIG. 1D, the BLM film 201 can be patterned to the predetermined part of the connecting hole 11, that is, to the electrode pad 9 and the peripheral part thereof.

This plasma processing step has been conducted under the condition that the substrate bias power supply voltage, which has been about 500 V in the related arts utilizing the parallel plate type plasma processing apparatus, is considerably reduced to 300 V. It is because the plasma generating power and substrate bias voltage can be individually set to the desired value as a result of constituting the independent high frequency power supplies to supply above voltages and the substrate bias voltage can be reduced without deterioration of the processing rate, thereby realizing moderate improvement of the property of the photoresist film surface.

Embodiment 2

In this embodiment, the present invention is applied to the preprocessing of film formation in the BLM sputtering process at the time of forming a ball bump, utilizing a plasma processing apparatus including ICP as the plasma generating source. The substrate to be processed used in this embodiment is identical to the substrate shown in FIG. 1A which is also used in the embodiment 1 and the same explanation will not be repeated.

Figure 4:
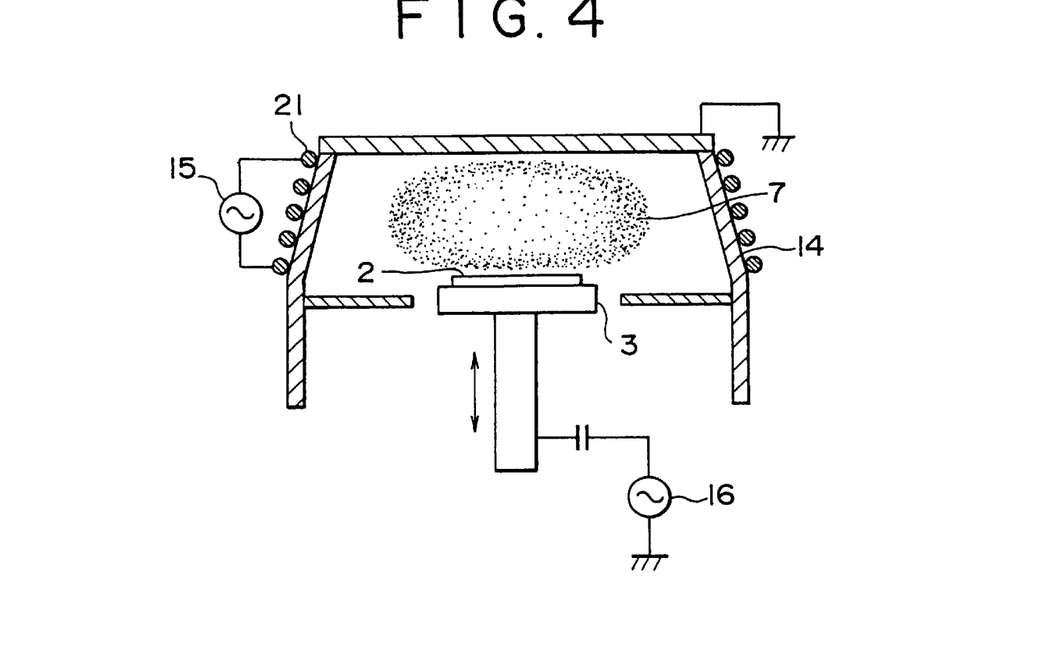
FIG. 4 is a cross-sectional view of a plasma processing apparatus loading an ICP used in the present invention.

An example of schematic constitution of the ICP processing apparatus used in this embodiment will be explained with reference to FIG. 4. This ICP processing apparatus supplies the power of the plasma power supply 15 to the plasma processing chamber 14 to generate high density plasma 7 therein with the plasma processing chamber 14 formed of a dielectric material such as quartz and an inductively coupled coil 21 wound in multiple around the side wall thereof. The substrate 2 to be processed is loaded on the substrate stage 3 to which the substrate bias power source 16 is supplied for execution of the predetermined plasma processing. Although not illustrated in the figure, the apparatus is naturally provided with a required processing gas introducing hole, a vacuum evacuation system, a gate valve and a substrate transfer system. This apparatus is characterized in realizing plasma energization with a high level power by utilizing a large size inductively coupled coil 21 of multiple turns and also realizes the processing with the high density plasma in the order of $10^{12}/cm^3$.

Figure 3:
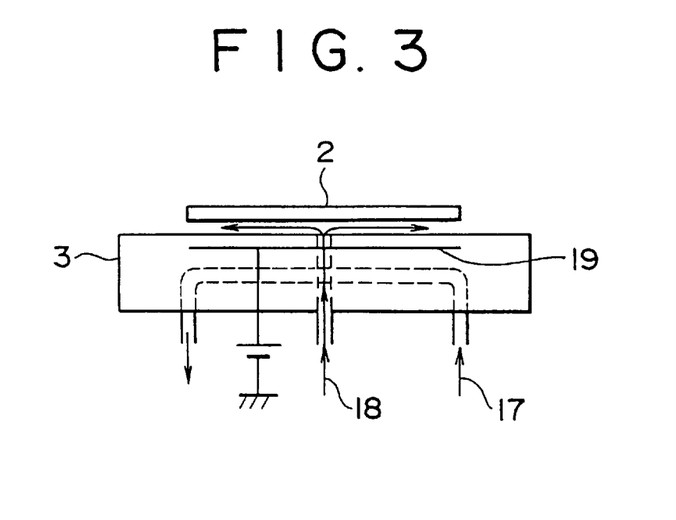
FIG. 3 is a cross-sectional view of a substrate stage of various types of plasma processing apparatus used in the present invention.

Moreover, like the embodiment 1, the substrate stage 3 is provided with temperature adjustment system by the coolant which is circulating within the stage 3 as shown in FIG. 3 and the thermal transfer between the stage surface and the substrate to be processed is effectively realized through electrostatic attraction by the electrostatic chuck and cooling by gaseous coolant.

The substrate 2 to be processed shown in FIG. 1A is set on the stage 3 and the preprocessing of metal film formation has been conducted under the condition explained below:

Argon gas flow rate: 25 sccm

Argon gas pressure: 1 mTorr

Plasma power source output: 1000 W (2 MHz)

Substrate bias voltage: 200 V (13.56 MHz)

In this embodiment, the processing can be realized under the condition that the substrate bias voltage is further lowered than that of the embodiment 1. This is a result of the constitution that the plasma source of the higher density than that of the embodiment 1 is used and thereby scattering of incident ions can be suppressed because gas pressure can be set to a lower value as the condition setting. Accordingly reduction of substrate bias voltage can be realized without jeopardizing processing rate due to irradiation of $Ar^+$ ion.

As a result, moderate control of substrate bias voltage is enabled and quick and uniform processing can also be realized even for a large diameter wafer. Moreover, as in the case of the embodiment 1, the BLM film of the excellent pattern can be formed finally by processing the resist to the optimum condition for the lift-off process without allowing the resist, unlike the related arts, to be burned and stick to the under layer due to excessive thermal change thereof.

Embodiment 3

In this embodiment, the present invention is applied to the preprocessing of film formation of the sputtering process of the BLM film at the time of forming a ball bump by utilizing a plasma processing apparatus having PTC (Transform Coupled Plasma) as the plasma source. This embodiment will then be explained with reference to FIG. 1 to FIG. 5.

The substrate to be processed used in this embodiment is identical to that of FIG. 1A used in the embodiment 1 and therefore the same explanation is not repeated here.

Figure 5:
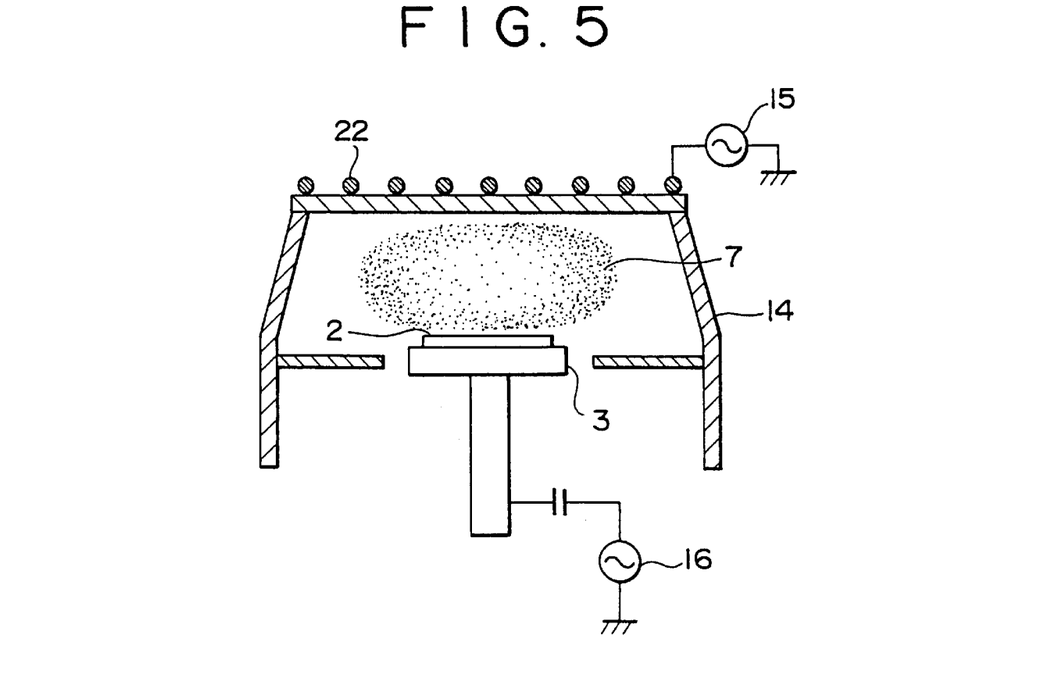
FIG. 5 is a cross-sectional view of a plasma processing apparatus loading a TCP (Transform Coupled Plasma) used in the present invention.

A constitution of the ICP processing apparatus used in this embodiment will be explained with reference to FIG. 5. This apparatus has a constitution which is basically identical to the ICP processing apparatus shown in FIG. 4 and the same constitutional elements are designated with the identical reference numerals and the same explanation is not repeated. The characteristic part of the present invention is that a ceiling plate of the plasma processing chamber 14 is formed of a dielectric material such as quartz and a spiral TCP coil 22 is arranged at the upper surface of the plasma processing apparatus to introduce the power of the plasma power source 15 into the plasma processing chamber 14. According to this apparatus, high density plasma in the order of $10^{12}/cm^3$ can be generated with inductive coupling between a large size TCP coil 22 and processing gas in the plasma processing chamber 14. Moreover, the substrate stage 3, like the embodiments explained previously, is adjusted in temperature with the coolant circulating within the stage as shown in FIG. 3 and the stage surface assures excellent thermal conduction with the wafer through electrostatic attraction and cooling by gas.

The substrate 2 to be processed shown in FIG. 1A is set on the substrate stage 3 and the preprocessing of metal formation process has been conducted, for example, under the following conditions:

Argon gas flow rate: 25 sccm

Gas pressure: 1 mTorr (0.13 Pa)

Plasma power source output: 1000 W (2 MHz)

Substrate bias voltage: 200 V (13.56 MHz)

The effect similar to that of the embodiment 2 explained above can be obtained in this embodiment.

Embodiment 4

In this embodiment, the present invention is applied to the preprocessing of film formation process in the BLM sputtering at the time of forming a solder ball bump by utilizing a plasma processing apparatus having ECR (Electron Cyclotron Resonance) as the plasma source.

Figure 6:
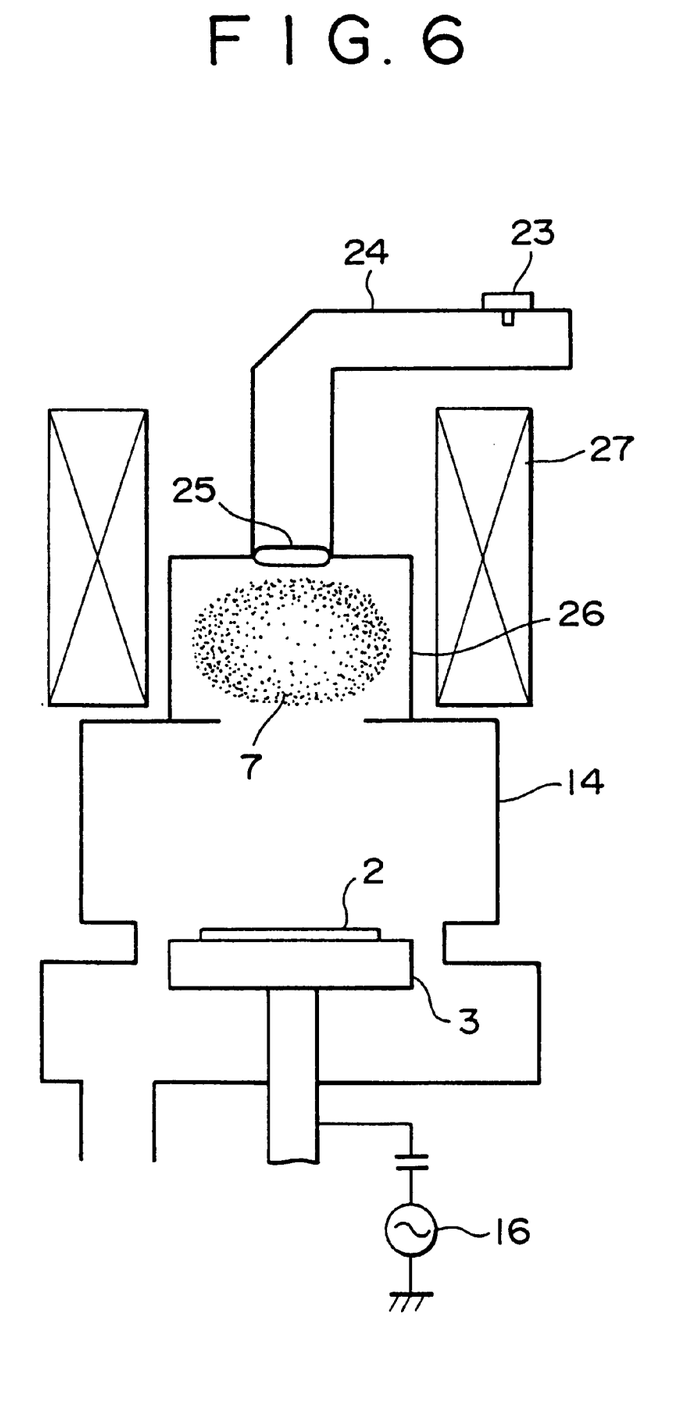
FIG. 6 is a cross-sectional view of a plasma processing apparatus loading an ECR (Electron Cyclotron Resonance) used in the present invention.

An example of the constitution of the ECR plasma processing apparatus used in this embodiment will be explained with reference to FIG. 6. The constitutional elements of above apparatus identical to that of the ICP processing apparatus shown in FIG. 4 are designated by the like reference numerals and the same explanation is not repeated here. The processing apparatus used in this embodiment introduces a microwave of 2.45 GHz generated by a magnetron 23 into the plasma generating chamber 26 via a microwave waveguide 24 and a microwave introducing window 25 consisting of a dielectric material such as quartz and generates high density plasma within the plasma generating chamber 26 through mutual effect with a magnetic field of 87.5 mT excited by a solenoid coil 27 arranged at the circumference of the plasma generating chamber 26. According to this apparatus, the processing gas in the plasma generating chamber 25 is dissociated in the higher efficiency under the ECR mode to generate high density plasma in the order of $10^{11}$ to $10^{12}/cm^3$.

The substrate 2 to be processed shown in FIG. 1 is set on the stage 3 and the preprocessing of metal film formation process has been conducted, for example, under the following conditions:

Argon gas flow rate: 25 sccm

Gas pressure: 1 mTorr (0.13 Pa)

Microwave power source output: 900 W (2.45 GHz)

Substrate bias voltage: 200 V (13.56 MHz)

As a result, like the embodiments explained above, the preprocessing of metal film formation process for processing photoresist to the condition most suitable to lift-off (exfoliation) process has been established and finally excellent pattern formation of the BLM film has also been realized.

Embodiment 5

In this embodiment, the present invention is applied to the preprocessing of film formation process of the BLM sputtering at the time of forming a solder ball bump by utilizing a substrate bias application type helicone wave plasma processing apparatus.

Figure 7:
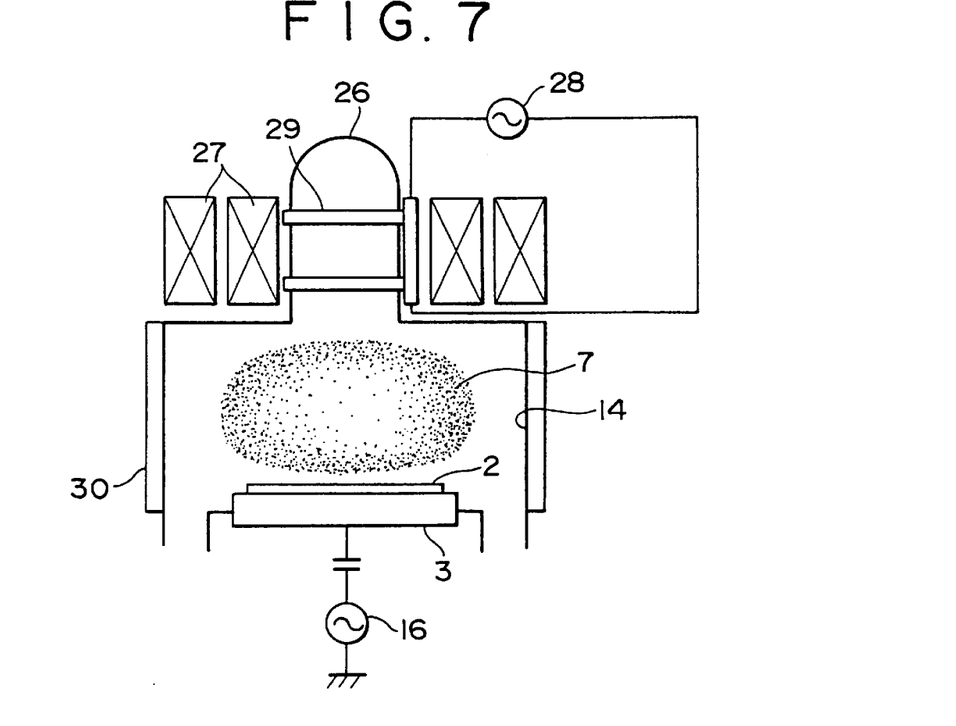
FIG. 7 is a cross-sectional view of a helicone wave plasma processing apparatus used in the present invention.

An example of the constitution of a substrate bias application type helicone wave plasma processing apparatus used in this embodiment is explained with reference to FIG. 7. The constitutional elements like that of the ICP processing apparatus shown in FIG. 4 are designated by the like reference numerals and the same explanation is not repeated here. This apparatus dissociates the processing gas, with high efficiency, supplied to the plasma generating chamber 26 consisting of a dielectric material such as quartz through mutual effects of the electric field which is generated by supplying an electric power to the helicone wave antenna 29 from the helicone wave power supply 28 and the magnetic field formed by the solenoid coil 27. The plasma generating changer 26 is communicated with the plasma processing chamber 14 to realize the processing by the diffusion type high density plasma 7. The reference numeral 30 denotes a multi-pole magnet arranged at the circumference of the plasma processing chamber 14 to generate a magnetic field for trapping the high density plasma 7 into the plasma processing chamber 14.

According to this substrate bias application type helicone wave plasma processing apparatus, it is possible, owing to the characteristics of the helicone wave antenna, to obtain the plasma density in the order of $10^{13}/cm^3$ which is higher than that in above embodiments.

The substrate 2 to be processed shown in FIG. 1A is set on the substrate stage 3 and the preprocessing of metal film formation has been conducted, for example, under the following conditions:

Argon gas flow rate: 25 sccm
Gas pressure: 1 mTorr (1.13 Pa)
Helicone wave power source output: 1000 W (2 MHz)
Substrate bias voltage: 200 V (13.56 MHz)

As a result, like the embodiments explained above, the preprocessing of metal film formation process for processing photoresist into the condition most suitable to lift-off (exfoliation) process has been established and finally the excellent pattern of the BLM film has also been formed.

Although five kinds of preferred embodiments of the present invention have been described above and illustrated in the accompanying drawings, the present invention is not limited thereto and is apparent to those skilled in the art that various modifications may be selected and made without departing from the principles of the invention such as constitution of sample, processing apparatus and processing conditions, etc.

Moreover, as explained above, in the preprocessing of a metal film formation process at the time of patterning a metal by utilizing the photoresist lift-off (exfoliation) method, employment of the present invention can provide a processing method which can set the substrate bias voltage to the adequate value and ensures quick and uniform processings even when a wafer (substrate to be processed) has a large diameter.

Moreover, in the preprocessing of BLM film formation process to form a solder ball bump, excellent pattern of the BLM film can finally be formed by processing the resist film into the condition most suitable for lift-off (exfoliation) process without resulting in the phenomenon that resist is burned and sticks to the under layer due to excessive thermal change.

The embodiments of the invention in which an exclusive property or privilege is claimed are defined as follows:

What is claimed is:

1. An apparatus for preprocessing a substrate prior to a metal film formation process comprising:
   a plasma processing chamber;
   a substrate stage disposed in said chamber;
   a substrate bias voltage supply connected to said stage for providing a bias voltage to a substrate placed on said stage;
   a plasma source which provides plasma for said chamber comprising an anode disposed inside said chamber and a grid electrode disposed in said chamber in a spaced relationship to said anode; and
   a plasma source power supply powering said plasma source, wherein said plasma source power supply is connected to said anode;
   wherein said plasma source power supply and said substrate bias voltage supply are independently controlled to provide independent outputs.

2. An apparatus as claimed in claim 1, wherein said plasma source further comprises a source of argon gas.

3. An apparatus as claimed in claim 1, wherein said substrate stage further comprises:
   an electrostatic chuck; and
   a coolant system.

4. An apparatus for preprocessing a substrate prior to a metal film formation process comprising:
   a plasma processing chamber;
   a substrate stage disposed in said chamber;
   a substrate bias voltage supply connected to said stage for providing a bias voltage to a substrate placed on said stage;
   a plasma source which provides plasma for said chamber;
   a plasma source power supply powering said plasma source, wherein said plasma source power supply and said substrate bias voltage supply are independently controlled to provide independent outputs; and
   a coolant system for cooling said substrate on said substrate stage comprising a first coolant path within said substrate stage in which a first coolant is circulated and a second coolant path within said substrate stage in which a second coolant, different from said first coolant, is circulated.

5. An apparatus as claimed in claim 4, wherein said plasma source further comprises:
   an inductive coil which is connected to said plasma source power supply and disposed around an outside surface of said chamber.

6. An apparatus as claimed in claim 4, wnerein said plasma source further comprises:
   a coil connected to said plasma source power supply and disposed over an upper surface of said chamber.

7. An apparatus as claimed in claim 4, wherein:
   said chamber is divided into a plasma generating chamber and a plasma processing chamber which are connected to each other; and
   said plasma source further comprises:
   a microwave source powered by said plasma source power supply which provides microwaves to said plasma generating chamber; and a solenoid coil for generating a magnetic field which is disposed around an outer surface of said plasma generating chamber.

8. An apparatus as claimed in claim 4, wherein bias voltage is about 300 V or less.

9. An apparatus as claimed in claim 4, wherein said plasma has a density between about $1\times10^{11}$ cm$^{-3}$ and about $1\times10^{14}$ cm$^{-3}$.

10. An apparatus as claimed in claim 4, wherein said first coolant is any one of freon, ethanol or nitrogen.

11. An apparatus as claimed in claim 4, wherein said second coolant is argon or helium.

12. An apparatus as claimed in claim 4, wherein said first coolant path comprises an intake and outlet on a lower side of said substrate stage opposite an upper side of said substrate stage on which a substrate is supported, said first coolant path having no intake or outlet on said upper side of said substrate stage.

13. An apparatus as claimed in claim 4, wherein said second coolant path comprises an intake on a lower side of said substrate stage opposite an upper side of said substrate stage on which a substrate is supported and an outlet on said upper side of said substrate stage.

14. An apparatus for preprocessing a substrate prior to a metal film formation process comprising:

a plasma processing chamber;

a substrate stage disposed in said chamber;

a substrate bias voltage supply connected to said stage for providing a bias voltage to a substrate placed on said stage;

a plasma source which provides plasma for said chamber; and a plasma source power supply powering said plasma source, wherein said plasma source power supply and said substrate bias voltage supply are independently controlled to provide independent outputs;

wherein:

said chamber is divided into a plasma generating chamber and a plasma processing chamber which are connected to each other; and said plasma source further comprises:

a helicone wave antenna powered by said plasma source power supply which is disposed around an outer surface of said plasma generating chamber; and a solenoid coil for generating a magnetic field which is disposed around said outer surface of said plasma generating chamber.

15. An apparatus as claimed in claim 1, wherein bias voltage is about 300 V or less.

16. An apparatus as claimed in claim 1, wherein said plasma has a density between about $1\times10^{11}$ cm$^{-3}$ and about $1\times10^{14}$ cm$^{-3}$.

* * * * *

UNITED STATES PATENT AND TRADEMARK OFFICE
CERTIFICATE OF CORRECTION

PATENT NO. : 6,013,580
DATED : January 11, 2000
INVENTOR(S) : Toshiharu Yanagida Page 1 of 1

It is certified that error appears in the above-identified patent and that said Letters Patent is hereby corrected as shown below:

Column 8, claim 6,
Line 55, should read;
    6. An apparatus as claimed in claim 4, wherein said plasma source further comprises:
    a coil connected to said plasma source power supply and disposed over an upper surface of said chamber.

Signed and Sealed this

Twelfth Day of March, 2002

*Attest:*

JAMES E. ROGAN
*Attesting Officer*     *Director of the United States Patent and Trademark Office*